(12) United States Patent
Brown et al.

(10) Patent No.: US 8,912,449 B2
(45) Date of Patent: Dec. 16, 2014

(54) THERMAL WARP COMPENSATION IC PACKAGE

(71) Applicants: Paul James Brown, Wakefield (CA); Alex L. Chan, Ottawa (CA)

(72) Inventors: Paul James Brown, Wakefield (CA); Alex L. Chan, Ottawa (CA)

(73) Assignee: Alcatel Lucent, Boulogne-Billancourt (FR)

( * ) Notice: Subject to any disclaimer, the term of this patent is extended or adjusted under 35 U.S.C. 154(b) by 99 days.

(21) Appl. No.: 13/728,168

(22) Filed: Dec. 27, 2012

(65) Prior Publication Data

US 2013/0113067 A1    May 9, 2013

Related U.S. Application Data

(62) Division of application No. 12/895,158, filed on Sep. 30, 2010, now abandoned.

(51) Int. Cl.
| | |
|---|---|
| *H05K 1/03* | (2006.01) |
| *H05K 1/00* | (2006.01) |
| *H05K 7/20* | (2006.01) |
| *H01L 21/58* | (2006.01) |
| *H01L 27/04* | (2006.01) |
| *H01L 23/498* | (2006.01) |

(52) U.S. Cl.
CPC ............ *H01L 27/04* (2013.01); *H01L 21/58* (2013.01); *H01L 2924/3511* (2013.01); *H01L 23/49816* (2013.01); *H01L 2924/15311* (2013.01); *H01L 23/49822* (2013.01)
USPC ........... 174/256; 174/252; 174/255; 174/547; 174/548

(58) Field of Classification Search
USPC ......... 174/252, 255, 256, 521, 525, 547, 548; 257/669, 713; 361/760, 783
See application file for complete search history.

(56) References Cited

U.S. PATENT DOCUMENTS

| | | | |
|---|---|---|---|
| 5,528,457 A | 6/1996 | Hawke et al. | |
| 5,907,190 A | 5/1999 | Ishikawa et al. | |
| 5,981,313 A | 11/1999 | Tanaka | |
| 6,014,317 A | 1/2000 | Sylvester | |
| 6,018,196 A * | 1/2000 | Noddin | 257/777 |
| 6,020,221 A * | 2/2000 | Lim et al. | 438/125 |
| 6,049,038 A | 4/2000 | Suzuki | |
| 6,195,264 B1 * | 2/2001 | Lauffer et al. | 361/762 |
| 6,320,754 B1 | 11/2001 | Dauksher et al. | |
| 6,329,713 B1 * | 12/2001 | Farquhar et al. | 257/712 |
| 6,744,132 B2 * | 6/2004 | Alcoe et al. | 257/706 |
| 6,815,258 B2 | 11/2004 | Vincent | |

(Continued)

OTHER PUBLICATIONS http://frontdoor.biz/HowToPCB/HowtoPCB-Thermal.html.*

*Primary Examiner* — Timothy Thompson
*Assistant Examiner* — Sherman Ng
(74) *Attorney, Agent, or Firm* — Kramer Amado, P.C.

(57) ABSTRACT

An apparatus and method for temperature induced warpage compensation in an integrated circuit package is disclosed. The apparatus consists of bonded layers of material having different thermal coefficients of expansion. The bonded layers are bonded to the top of the integrated circuit package. By appropriate choice of temperature coefficients the layers of material can compensate for either convex or concave warpage. In some embodiments, the layers of material have apertures therein allowing compensation for more complex warpages. As well, in some embodiments the top layer of material does not have a planar cross-section. A method is also disclosed for manufacturing an integrated circuit package assembly. The apparatus and method provide an alternative to methods of dealing with IC package warpage known in the art.

10 Claims, 3 Drawing Sheets

(56) References Cited

U.S. PATENT DOCUMENTS

| | | |
|---|---|---|
| 6,982,192 B1 * | 1/2006 | Vodrahalli et al. ............ 438/122 |
| 7,009,307 B1 * | 3/2006 | Li ................................. 257/783 |
| 7,176,563 B2 | 2/2007 | Duchesne et al. |
| 2001/0013640 A1 * | 8/2001 | Tao ................................ 257/667 |
| 2002/0108768 A1 * | 8/2002 | Jimarez et al. ............... 174/52.4 |
| 2006/0205119 A1 * | 9/2006 | Appelt et al. ................. 438/125 |
| 2010/0065929 A1 | 3/2010 | Okada et al. |

* cited by examiner

FIG. 2a
PRIOR ART
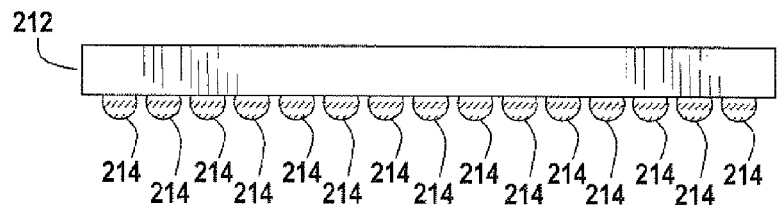
FIG. 2b
PRIOR ART
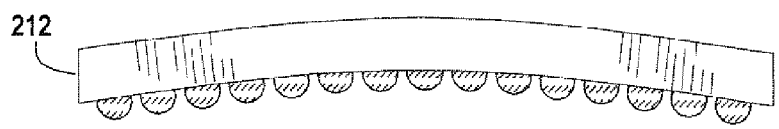
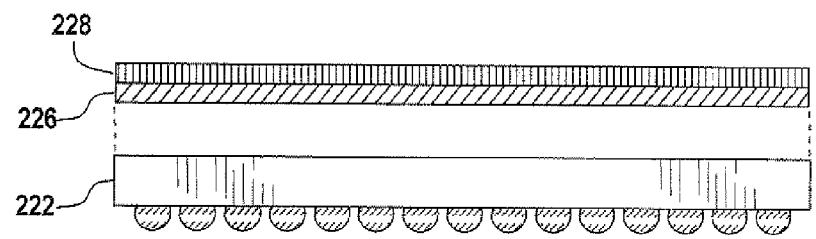
FIG. 2c
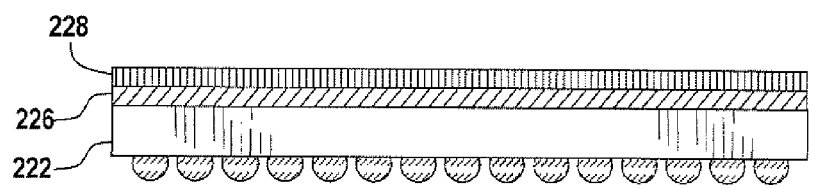
FIG. 2d

FIG. 3a
PRIOR ART
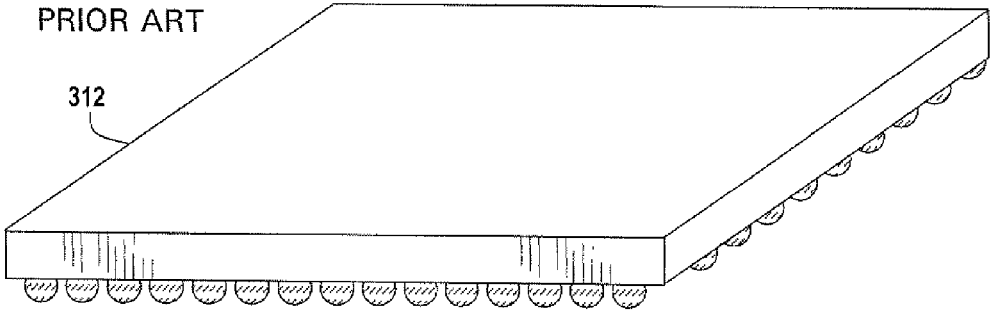
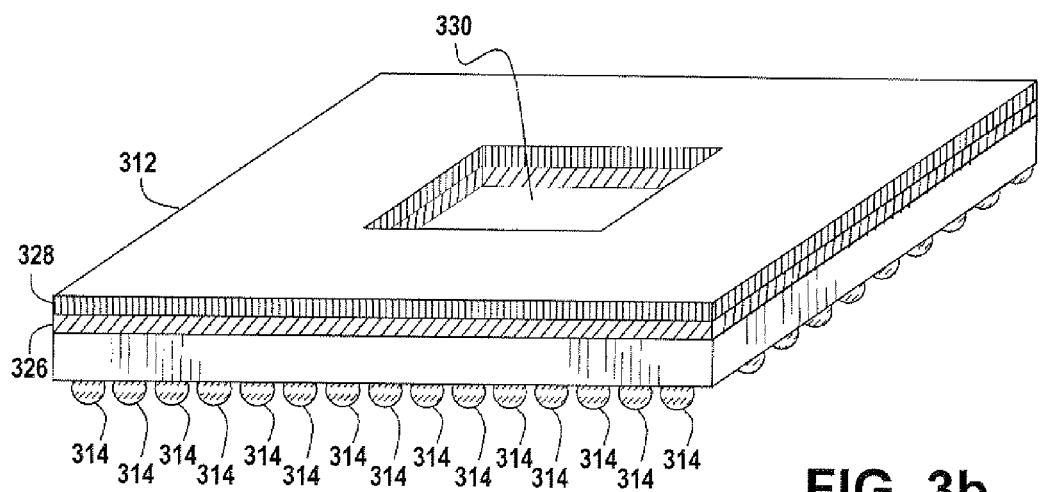
FIG. 3b

THERMAL WARP COMPENSATION IC PACKAGE

This application is a divisional of Ser. No. 12/895,158, filed on Sep. 30, 2010.

FIELD

The invention relates to warping of integrated circuit (IC) packages during manufacturing processing and is particularly concerned with providing a means for generally neutralizing the warpage by use of a counter-warping element.

BACKGROUND

A wide variety of semiconductor packages having integrated circuits (IC) are used in industry. In general, ICs and their packages have become more complex over time, with the result that their power, speed, and size has been increasing. With increased size and complexity also arise an increased number of connections from the IC to the larger electronics assembly of which it is a part. Historically, pin counts of Very Large Scale Integrated (VLSI) circuits exceeded the limits for dual in-line packaging (DIPs), leading to development of the Pin Grid Array (PGA). In the PGA, the inputs and outputs of the IC are connected to an IC package in which pins are arranged in a square array that may cover up to the entire bottom of the package. The pins conduct electrical signals from the IC to the printed circuit board (PCB) in which or on which the IC package is mounted. A subsequent development to the PGA is that of the Ball Grid Array, or BGA, in with the pins are replaced by balls of solder affixed to the bottom of the IC package. During assembly to the printed circuit board, the BGA and printed circuit board are heated, causing the solder balls to melt and solder the IC package to the printed circuit board.

As the BGA packaging offers additional advantages, such as improved heat conduction due to the lower thermal resistance between the package and PCB, a lower inductance connection than pins, and reduced solder connection bridging; it has become a preferred packaging type.

One disadvantage of BGAs however, is the requirement for flatness during processing. In general, the solder connections require a tight mechanical tolerancing during processing in order to preclude mechanical stresses which would promote solder joint failure.

Working against this requirement, however, is the difference in thermal coefficient of expansion which exists between the substrate upon which the solder balls are mounted, and the silicon IC mounted upon the substrate. The differences in the thermal coefficient of expansion lead to warpage of the BGA package as a whole. This warpage, which for the purposes of this specification refers to a bending or twist or general lack of flatness in the overall IC package, including in particular the plane formed by the solder joint locations, can cause a variety of problems. A non-exhaustive list by way of example includes problems such as fractured solder joints, open contact solder joints, pillowed joints, or intermittent contact solder joints.

The problem of warpage is exacerbated by larger package sizes, and by elevated processing temperatures. As trends in IC complexity are consistently in the direction of larger package sizes, and as production changes in the direction of lead free solders yield higher processing temperatures, the problem of IC warpage is a pressing one. It is important to note that the desired tolerance for flatness at and across the processing temperature range can be very high. For example, for BGA packages having a size of greater than 1" across, there may be a maximum warpage tolerance of on the order of 0.008" allowed.

One prior solution to the problem of IC package warping has been the incorporation on top of the IC of a flat stiffener plate. The stiffener plate takes the form essentially of a completely flat entirely planar item having a constant thickness, and is a simple quadrilateral having approximately its perimeter as the size of the IC package perimeter when viewed from the top. A central region of the flat stiffener plate may be cut out in certain applications, for example to allow access of a thermally conductive element.

However, these stiffener flat plates suffer from the disadvantage that they themselves are entirely flat, and thus, have a somewhat limited resistance to warping due to temperature change or torsion or bending forces. In order to make a flat plate strong enough to provide desirable resistance to warping in the overall IC package, it can be necessary to make the stiffening plate undesirably thick. It is undesirable for the stiffening plate, which rests on top of the IC, to be too thick because the thick stiffening plate, on top of and added to the IC thickness, causes the entire assembled IC package to be thick, thus potentially limiting IC packaging placement options and/or increasing printed circuit card to printed circuit card separation in the final system assembly.

Further, the added stiffener thickness increases the IC die-to-lid spacing, thereby creating a larger separation that needs to be filled with thermal interface material, the longer thermal path ultimately impeding thermal dissipation from the IC. Moreover, because of the stiffener's entirely flat cross-sectional profile, increased stiffness is achieved inefficiently though the increase of the overall volume of material, thus adding additional cost and weight to the final IC package.

In view of the foregoing, it would be desirable to provide a means of decreasing warpage of IC packages. In particular, it would be desirable to provide a means that can provide improved performance and/or mounting reliability while providing a desirable low degree of thickness and/or a desirable low amount of material.

SUMMARY

It is an object of the invention to provide a temperature responsive warpage counteracting integrated circuit assembly.

According to an aspect of the invention there is provided a temperature responsive warpage counteracting integrated circuit assembly for use with an integrated circuit package having a connection grid side and a top side. The integrated circuit assembly has a first layer of a first material having a first coefficient of temperature expansion and a first and second surface; a second layer of a second material having a second coefficient of temperature expansion different from the first coefficient of temperature expansion and a first and second surface; the first surface of the second layer is bonded to the second surface of the first layer; and the second surface of the second layer is bonded to the top side of the integrated circuit package.

In some versions of this embodiment, the first coefficient of temperature expansion is greater than the second coefficient of temperature expansion, while in other embodiments the second coefficient of temperature expansion is greater than the first coefficient of temperature expansion.

Advantageously, in some versions of this embodiment, there may be apertures in the first and second layers, and, in some versions, these apertures are of a similar size and aligned.

Advantageously, in some versions, the first layer may have a planar-convex cross-section with the planar portion at the second surface. In other versions of this embodiment, the first layer may have a planar-concave cross-section with the planar portion at the second surface.

In another embodiment of the invention, there is provided a temperature responsive warpage counteracting integrated circuit assembly for use with an integrated circuit package having a connection grid side and a top side. The integrated circuit assembly has a layer of a material having a coefficient of temperature expansion that varies from a first value at a first surface to a second value at a second surface; and the second surface of the layer of material is bonded to the top side of the integrated circuit package. In some versions of this embodiment, the first value is larger than the second value, while in other versions the second value is larger than the first value.

Advantageously, in some versions of this embodiment, the layer has an aperture therein. Also advantageously, in some versions of this embodiment, the layer has a planar-convex or planar-concave cross-section with the planar portion being at the surface bonded to the integrated circuit package.

In another embodiment of the invention, there is provided a method of manufacture of a temperature responsive warpage counteracting integrated circuit assembly for use with an integrated circuit package having a connection grid side and a top side. The method has the steps of providing a first layer of a first material having a first coefficient of temperature expansion and a first and second surface; providing a second layer of a second material having a second coefficient of temperature expansion different from the first coefficient of temperature expansion and a first and second surface; bonding the first surface of the second layer to the second surface of the first layer; and bonding the second surface of second layer to the top side of the integrated circuit package.

In some versions of this embodiment, there is the step of providing that the first coefficient of temperature expansion is greater than the second coefficient of temperature expansion. In other versions of this embodiment, there is the step of providing that the second coefficient of temperature expansion is greater than said the coefficient of temperature expansion.

Advantageously, in some versions of this embodiment there are the additional steps of providing a first aperture in the first layer; and providing a second aperture in the second layer, wherein the second aperture is of generally the same size as the first aperture, and aligned with the first aperture.

In yet another embodiment of the invention, there is provided a method of manufacture of a temperature responsive warpage counteracting integrated circuit assembly for use with an integrated circuit package having a connection grid side and a top side, the method having the steps of providing a layer of a material having a coefficient of temperature expansion that varies from a first value at a first surface to a second value at a second surface; and bonding the second surface of the layer of material to the top side of the integrated circuit package. In some versions of this embodiment, there is the step of providing that the first value is greater than the second value. In other versions of this embodiment, there is the step of providing that the second value is greater than the first value.

Advantageously, in some versions of this embodiment, there is the additional step of providing an aperture in the layer of material.

Note: in the following the description and drawings that follow merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

BRIEF DESCRIPTION OF THE DRAWINGS

The present invention will be further understood from the following detailed description of embodiments of the invention, with reference to the drawings in which:

FIG. 2a illustrates another cross-sectional drawing of an integrated circuit package in accordance with the prior art;

FIG. 2b illustrates a cross-sectional drawing of the integrated circuit package of FIG. 2a which is showing a convex warpage due to elevated temperature;

FIG. 2c illustrates an exploded cross-sectional drawing of an integrated circuit package and a warpage compensation element in accordance with another embodiment of the present invention;

FIG. 2d illustrates a cross-sectional drawing of the integrated circuit package and warpage compensation element of FIG. 2c bonded together in accordance with an embodiment of the present invention;

FIG. 3a illustrates an isometric drawing of an integrated circuit package in accordance with the prior art; and FIG. 3b illustrates an isometric drawing of the integrated circuit package of FIG. 3a with a warpage compensation element bonded thereto where the warpage compensation element has an aperture.

Figure 1A:
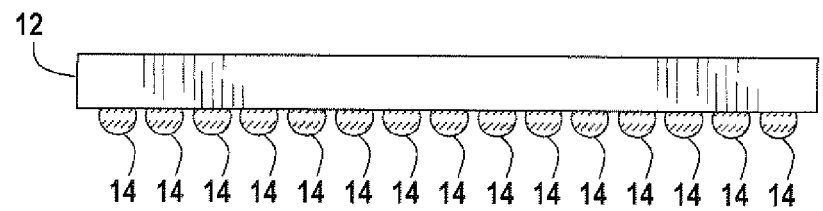
FIG. 1a illustrates a cross-sectional drawing of an integrated circuit package which in accordance with the prior art.

In the following figures, like features bear similar reference labels.

DETAILED DESCRIPTION

Referring now to the drawings, in which like numerals refer to like components or steps, there are disclosed broad aspects of various exemplary embodiments.

Many embodiments relate to a warpage reducing element that can be attached to an integrated circuit (IC) package. As used throughout this document, the terms IC (integrated circuit) and IC packaging are used interchangeably to make reference to the overall component assembly, which is also commonly referred to as the IC package. Examples of IC packages include for example TSOPS, QFPs, SOIC, BGA, CCGA, etc. It is noted that for packages containing above approximately 400 connections, IC packaging almost exclusively take on the form of Area Array style packaging, which itself can include various subtypes, such as for example Column Grid Arrays (CCGA), Pin Grid Arrays (PGA), and Ball Grid Arrays (BGA). The stiffener solutions that are described herein are applicable to such Area Array devices, including for example BGAs. The term IC assembly is used herein to refer to an IC or IC package that has a warpage reducing element incorporated therein or mounted thereto.

When referring herein to a plane, the reference includes the concept of a flat plate, which actually has a top and bottom flat surface and some thickness, with the top and bottom flat surfaces technically lying along parallel planes. Planar herein includes the concept of a plate being planar although it has such a thickness. Additionally, when referring herein to a planar-convex cross-section, the reference includes the concept of a plate having a flat bottom and a convex top surface. Likewise, when referring herein to a planar-concave cross-section, the reference includes the concept of a plate having a flat bottom and a concave top surface.

Referring to FIG. 1a there may be seen an IC 12 with a plurality of solder bumps 14. The solder bumps are for making connections to pads at a mounting location, for example on a printed circuit board.

Figure 1B:
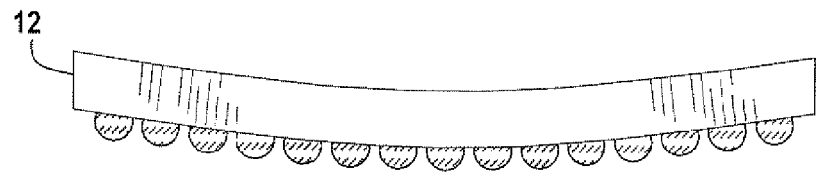
FIG. 1b illustrates a cross-sectional drawing of the integrated circuit package of FIG. 1a which is showing a concave warpage due to elevated temperature.

Referring to FIG. 1b there may be seen the IC 12 with an exaggerated depiction of the warpage effect of a high temperature. Such a high temperature may occur during processing, for example when the IC 12 is being mounted on a printed circuit board. In the case of processing with lead free solders, this high temperature may be on the order of 260° C. In this case the resulting warpage is concave in nature. The warpage generally results from a mismatch between the thermal coefficient of expansion of the silicon IC die and the thermal coefficient of expansion of the IC carrier to which the silicon die is affixed.

Figure 1C:
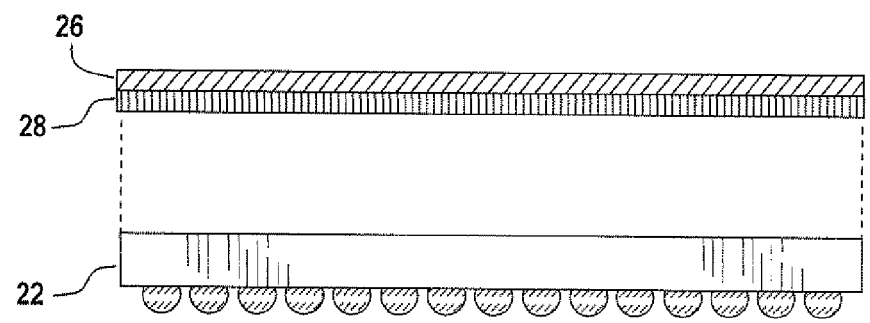
FIG. 1c illustrates an exploded cross-sectional drawing of an integrated circuit package and a warpage compensation element in accordance with an embodiment of the present invention.

Referring to FIG. 1c there may be seen an IC 22. Also depicted is an assembly of materials having a first layer 26 and a second layer 28. Layers 26 and 28 are bonded together over their cojoined surfaces. In FIG. 1c, first layer 26 has a thermal coefficient of expansion which is larger than the thermal coefficient of expansion of second layer 28. Due to the differences in their respective thermal coefficient of expansion, a positive change in temperature will result in a greater degree of expansion of layer 26 than of cojoined layer 28. The net result of this greater degree of expansion, coupled with the cojoining of the layers is to induce a warpage in the combined layers which is opposite in nature to the warpage of the IC 12 in FIG. 1b.

Figure 1D:
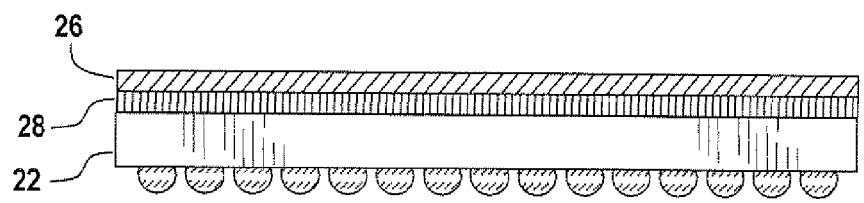
FIG. 1d illustrates a cross-sectional drawing of the integrated circuit package and the warpage compensation element of FIG. 1c bonded together in accordance with an embodiment of the present invention.

Referring to FIG. 1d there may be seen the resulting temperature responsive warpage counteracting IC assembly wherein layer 28 is bonded to the surface of IC 22. This bonding may be effected by appropriate adhesives.

Alternatively, according to another embodiment of the invention, layer 28 may be built up via plating the surface of IC 22, and layer 26 established by plating the surface of layer 28.

Alternatively, according to yet another embodiment of the invention, layer 28 may be built up via plating the surface of IC 22, and layer 26 bonded to the surface of layer 28 by an appropriate adhesive.

Referring now to FIG. 2a there may be seen an IC 212 with a plurality of solder bumps 214. As previously described, the solder bumps are for making connections to pads at a mounting location, for example on a printed circuit board.

Referring to FIG. 2b there may be seen the IC 212 with an exaggerated depiction of the warpage effect of a high temperature. In this case the resulting warpage is convex in nature. This warpage generally results where the mismatch between the thermal coefficient of expansion of the silicon IC die and the thermal coefficient of expansion of the IC carrier to which the silicon die is affixed is opposite in nature to the situation depicted in FIG. 1b.

Referring to FIG. 2c there may be seen an IC 222. Also depicted is an assembly of materials having a first layer 228 and a second layer 226. Layers 228 and 226 are bonded together over their cojoined surfaces. In FIG. 2c, first layer 228 has a thermal coefficient of expansion which is smaller than the thermal coefficient of expansion of second layer 226. Due to the differences in their respective thermal coefficient of expansion, a positive change in temperature will result in a greater degree of expansion of layer 226 than of cojoined layer 228. The net result of this greater degree of expansion, coupled with the cojoining of the layers is to induce a warpage in the combined layers which is opposite in nature to the warpage of the IC 212 in FIG. 2b.

Referring to FIG. 2d there may be seen the resulting temperature responsive warpage counteracting IC assembly wherein layer 226 is bonded to the surface of IC 222. This bonding may be effected by appropriate adhesives.

Alternatively, according to another embodiment of the invention, layer 226 may be built up via plating the surface of IC 222, and layer 228 established by plating the surface of layer 226.

Alternatively, according to yet another embodiment of the invention, layer 226 may be built up via plating the surface of IC 222, and layer 228 bonded to the surface of layer 226 by an appropriate adhesive.

Referring now to FIG. 3a there may be seen an isometric depiction of IC 312. As previously described, the solder bumps visible on the lower surface of IC 312 are for making connections to pads at a mounting location.

Referring now to FIG. 3a there may be seen an isometric depiction of IC 312. As previously described, the solder bumps visible on the lower surface of IC 312 are for making connections to pads at a mounting location.

Referring now to FIG. 3b, there may be seen an isometric depiction of the resulting temperature responsive warpage counteracting IC assembly wherein a first layer 326 is bonded to the surface of IC 312, and a second layer 328 is bonded to first layer 326. In this embodiment, an aperture 330 has been provided which pierces both first layer 326 and second layer 328. This aperture 330 will relieve the bending forces provided by the mismatched thermal coefficients of expansion of first layer 326 and second layer 328. Such a relief may be useful in situation wherein there is little warpage in the vicinity of the silicon die, and thus warpage counteracting compensation is unnecessary. Such apertures may also be useful in embodiments wherein more complex warpages than simple convex or simple concave warpages exist. As the counteracting forces tend to zero force in the vicinity of the aperture, warpage compensation can be tailored more precisely to the needs of a particular IC package.

According to yet another embodiment of the invention, the topmost layer, for example layer 26 in FIG. 1d, or layer 228 in FIG. 2d, is not of uniform thickness. In this embodiment, a cross-section of the topmost layer is in the form of a planar-convex section, or a planar-concave section. The planar portion of the section is on the face cojoined with the lower layer. By varying the thickness of the topmost layer, additional degrees of expansion over specific regions of the IC package may be established. This embodiment thus offers a further provision for fine tuning the warpage counteraction forces according to the needs of the specific IC package.

The choice of materials for the layers is ultimately dictated by factors including considerations of cost, availability, and compatibility with manufacturing processes. Possible material choices include pairings such as copper/steel, and aluminum/copper. Other materials which may be of interest include stainless steel because of its low reactivity and Invar™ because of its low coefficient of thermal expansion. In terms of thickness, material layers having an overall thickness in the range of 0.5 mm to 1.5 mm are suitable, however it is contemplated that greater and lesser thicknesses could be of use in particular circumstances.

By way of example, one prototype warpage counteracting element modeled was formed of a first layer of steel having a thickness of 1.2 mm, and a second layer of copper having a thickness of 0.1 mm. The overall thickness was the sum of these layers yielding a 1.3 mm thick element. This element, sized to that of an IC package, produced a curvature of 0.0107" (0.27 mm) over a 200° C. temperature shift, which is representative of both the order of magnitude of package curvatures which need to be counteracted, and of the temperature delta between room temperature ambient and solder reflow processing temperatures.

According to yet another embodiment of the invention, a single layer of material is provided for bonding to the surface of the IC package. This single layer of material is formulated so that the thermal coefficient of expansion of the layer of material varies from a first value at one surface, to a second value at the other surface. Such variation may be induced by, for example, loading a material matrix with varying densities of filler. The net effect of the variation in thermal coefficient of expansion across the depth of the material results in bending forces similar to that of the two layer embodiment. The use of such a formulated material may be applicable to situations where a suitable combination of paired coefficients of thermal expansion cannot be found.

In summary, an apparatus has been disclosed which provides a means to counteract the warpage of IC packages at elevated temperatures. In some embodiments the apparatus consists of a cojoined pair of layers of material having mismatched coefficients of thermal expansion, where the layers are bonded to the surface of the IC package. In some embodiments the topmost layer is non-planar. In other embodiments, at least one aperture is let into the two layers. In one disclosed embodiment, a formulated material having a thermal coefficient of expansion which varies from one surface to the other surface is used in place of the two layers.

It is to be understood that various changes in the details, materials, and arrangements of the parts which have been described and illustrated in order to explain the nature of this invention may be made by those skilled in the art without departing from the scope of the invention as expressed in the following claims.

It should also be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation." Numerous modifications, variations and adaptations may be made to the embodiment of the invention described above without departing from the scope of the invention, which is defined in the claims.

What is claimed is:

1. A temperature responsive warpage counteracting integrated circuit assembly for use with an integrated circuit package having a connection grid side and a top side, said temperature responsive warpage counteracting integrated circuit assembly comprising:
   a first layer of a first material having a first coefficient of temperature expansion and a first and second surface;
   a second layer of a second material having a second coefficient of temperature expansion different from said first coefficient of temperature expansion and a first and second surface;
   said first surface of said second layer bonded to the second surface of said first layer; and
   said second surface of second layer bonded to the top side of said integrated circuit package, wherein the first layer has either a planar-convex cross section or a planar-concave cross section with a planar portion at the second surface.

2. The temperature responsive warpage counteracting integrated circuit assembly as claimed in claim 1, wherein said first coefficient of temperature expansion is greater than said second coefficient of temperature expansion.

3. The temperature responsive warpage counteracting integrated circuit assembly as claimed in claim 1, wherein said second coefficient of temperature expansion is greater than said first coefficient of temperature expansion.

4. The temperature responsive warpage counteracting integrated circuit assembly as claimed in claim 1, wherein said first and second layers have aligned apertures therein.

5. The temperature responsive warpage counteracting integrated circuit assembly as claimed in claim 1, wherein said first layer has the planar-convex cross section with the planar portion at said second surface.

6. The temperature responsive warpage counteracting integrated circuit assembly as claimed in claim 1, wherein said first layer has the planar-concave cross section with the planar portion at said second surface.

7. A method of manufacture of a temperature responsive warpage counteracting integrated circuit assembly for use with an integrated circuit package having a connection grid side and a top side, said method comprising:
   providing a first layer of a first material having a first coefficient of temperature expansion, a first surface, and a second surface;
   providing a second layer of a second material having a second coefficient of temperature expansion different from said first coefficient of temperature expansion, a first surface, and a second surface;
   bonding said first surface of said second layer to the second surface of said first layer; and
   bonding said second surface of second layer to the top side of said integrated circuit package, wherein the first layer has either a planar-convex cross section or a planar-concave cross section with a planar portion at the second surface.

8. The method of manufacture of a temperature responsive warpage counteracting integrated circuit assembly as claimed in claim 7, further comprising:
 providing that said first coefficient of temperature expansion is greater than said second coefficient of temperature expansion.

9. The method of manufacture of a temperature responsive warpage counteracting integrated circuit assembly as claimed in claim 7, further comprising:
 providing that said second coefficient of temperature expansion is greater than said first coefficient of temperature expansion.

10. The method of manufacture of a temperature responsive warpage counteracting integrated circuit assembly as claimed in claim 7, further comprising:
 providing a first aperture in said first layer; and
 providing a second aperture in said second layer, wherein said second aperture is of generally the same size as said first aperture, and aligned with said first aperture.

* * * * *